United States Patent [19]

Chapple-Sokol et al.

[11] Patent Number: 5,665,608

[45] Date of Patent: Sep. 9, 1997

[54] METHOD OF ALUMINUM OXIDE LOW PRESSURE CHEMICAL VAPOR DEPOSITION (LPCVD) SYSTEM-FOURIER TRANSFORM INFRARED (FTIR) SOURCE CHEMICAL CONTROL

[75] Inventors: Jonathan Daniel Chapple-Sokol, Poughkeepsie; Richard Anthony Conti, Mt. Kisco; James Anthony O'Neill, New City; Narayana V. Sarma, Verbank; Donald Leslie Wilson, New Windsor, all of N.Y.; Justin Wai-Chow Wong, South Burlington, Vt.

[73] Assignee: International Business Machines Corporation, Armonk, N.Y.

[21] Appl. No.: 386,403

[22] Filed: Feb. 10, 1995

Related U.S. Application Data

[62] Division of Ser. No. 234,900, Apr. 28, 1994, Pat. No. 5,431,734.

[51] Int. Cl.[6] .................................................. H01L 21/66
[52] U.S. Cl. ............................. 438/7; 438/778; 438/935
[58] Field of Search ................................. 437/225, 235, 437/8; 427/10; 118/712, 688

[56] References Cited

U.S. PATENT DOCUMENTS

| 4,388,342 | 6/1983 | Suzuki et al. | 427/8 |
|---|---|---|---|
| 5,138,163 | 8/1992 | Butler et al. | 250/339 |
| 5,190,913 | 3/1993 | Higashiyama et al. | 505/1 |
| 5,534,066 | 7/1996 | O'Neill et al. | 118/712 |

FOREIGN PATENT DOCUMENTS 3023293A  6/1989  Japan.

Primary Examiner—Charles L. Bowers, Jr.
Assistant Examiner—Reneé R. Berry
Attorney, Agent, or Firm—Whitham, Curtis, Whitham & McGinn; Alison D. Mortinger

[57] ABSTRACT

A method and apparatus for monitoring and controlling reactant vapors prior to chemical vapor deposition (CVD). The reactant vapors are monitored at full concentration without sampling as they are transported to a CVD reactor. Contaminants detected cause a process controller to switch the transport path to direct reactant vapors to a system pump.

4 Claims, 1 Drawing Sheet

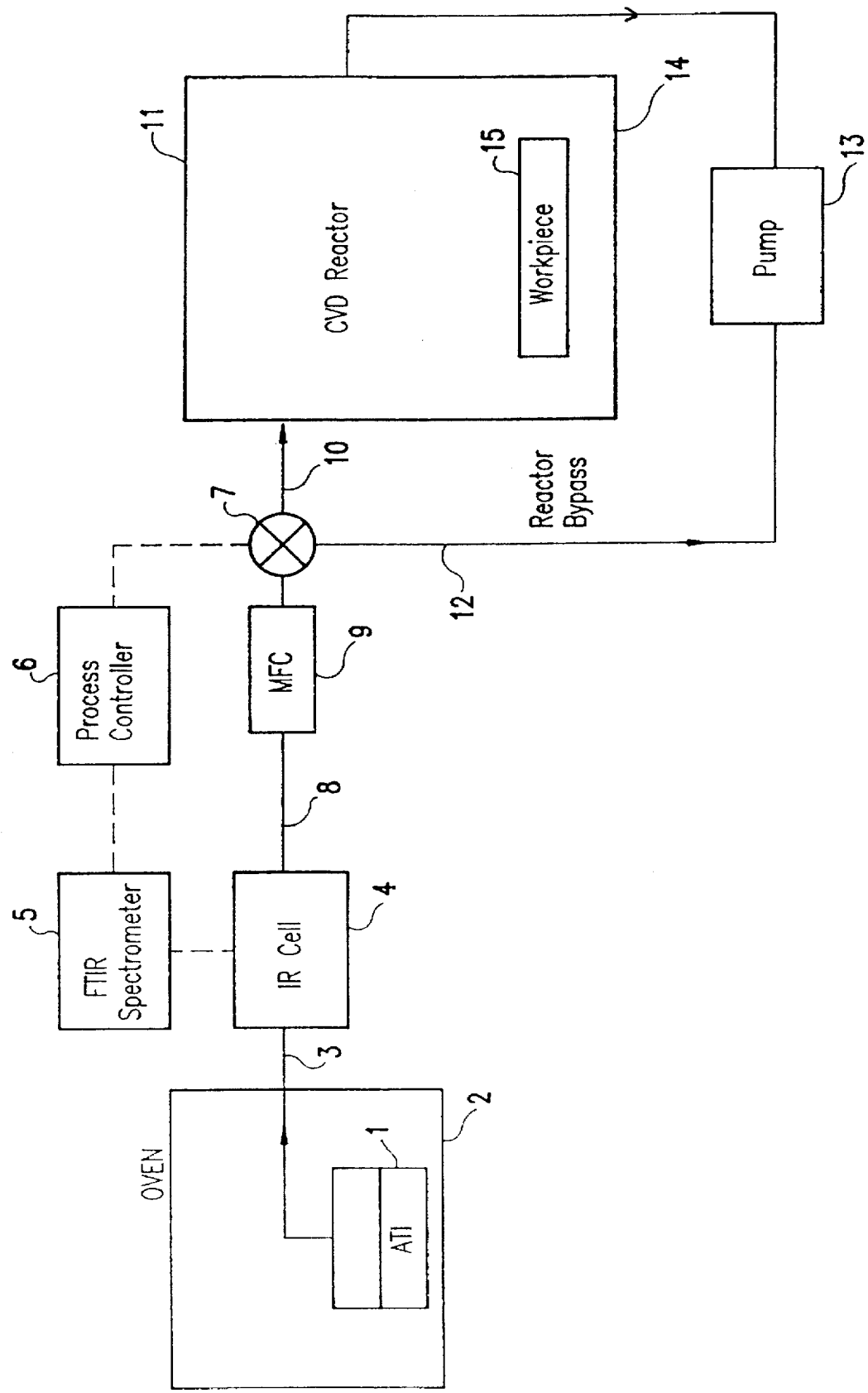

METHOD OF ALUMINUM OXIDE LOW PRESSURE CHEMICAL VAPOR DEPOSITION (LPCVD) SYSTEM-FOURIER TRANSFORM INFRARED (FTIR) SOURCE CHEMICAL CONTROL

CROSS REFERENCE TO RELATED APPLICATION

This application is a divisional of application Ser. No. 08/234,900 filed Apr. 28, 1994, now U.S. Pat. No. 5,437,734.

BACKGROUND OF THE INVENTION

1. Field of the Invention

The present invention generally relates to control of deposition processes in the manufacture of semiconductor devices and, more particularly, to the elimination of starvation of the deposition process upon initiation of Low Pressure Chemical Vapor Deposition (LPCVD) after an idle period due to exposure to a deleterious vapor or a lack of correct feed vapor composition, using infrared source verification.

2. Description of the Prior Art

Compositions of reactive vapors have been analyzed within a Chemical Vapor Deposition (CVD) reactor using a vapor by-pass and flame emission spectroscopy.

Gas analyzers, such as hydrogen flame ionization detector or thermal conductivity detector, have been used to measure and control the flow of raw materials into reactors used for deposition on superconducting films. With this method, the concentration of gases in the primary gas stream is not sampled directly. Also, the measurement technique does not allow measurements to be made in real-time while the gas is flowing to the reactor.

Gas analyzers have also been used to measure the concentration of a reactant gas and to control the rate of gas supply from an auxiliary gas supply. With such a method, the reactant gas is not sampled directly in the delivery lines leading to the chamber, but sampled indirectly through a tube inserted into the reactor. Because of the method of gas sampling, the workpiece is exposed to potentially undesirable chemicals.

Fourier Transform Infrared (FTIR) spectroscopy has been used to perform online gas analysis of a multicomponent gas flow from a combustion engine. This method measures the components present in an exhaust stream, but not the reactants in an input stream. The FTIR sensor performs measurements after the reaction process not before and measures only a diluted gas sample.

The prior art does not sample gas directly through a line which leads to a gas collector and separation column, monitoring the gas stream nondestructively prior to exposing the workpiece. The prior art does not describe a control scheme where the measurements of the gas concentrations are used to switch the input stream. A closed circuit valve controller activated by an FTIR output to redirect the reactive gas from the CVD reactor to a bypass connector used jointly with an in-line FTIR cell for the analysis of the reactive gas being supplied to a generalized CVD reactor, has not been taught previously. In a CVD system, it is important that the reactor is not exposed to potentially deleterious impurities, so monitoring must be performed prior to allowing gases to enter the reactor.

SUMMARY OF THE INVENTION

It is therefore an object of the present invention to provide the use of infrared (IR) absorption spectroscopy to determine the concentration of input vapors to a reactor in realtime and to adjust the vapor delivery system in response to variations in the vapor concentration.

In a preferred embodiment, this invention relates specifically to the delivery of aluminum tri-isopropoxide (ATI) to a chemical vapor deposition (CVD) reactor used to deposit aluminum oxide on a workpiece in the manufacture of semiconductor devices. A Fourier transform infrared (FTIR) spectrometer is used to provide a control signal to direct ATI to the reactor or a vent line depending on whether contaminants and decomposition products are present in the vapor stream.

Unlike other applications, the present invention provides a mechanism to prevent exposing a workpiece to potentially destructive vapors resulting from the premature decomposition or polymerization of reactant in its source ampule. Such reactant modification takes place because the large volume of reactant that is present in the ampule is inherently unstable under storage conditions. Decomposition products are often more volatile than the reactant, so that even when they are present in small molar concentrations within the ampule, they can represent a significant if not overwhelming fraction of the material in the vapor phase in the ampule and the delivery system as a whole. The dynamic FTIR switch protects the reactor and the workpiece from these contaminants.

BRIEF DESCRIPTION OF THE DRAWINGS

The foregoing and other objects, aspects and advantages will be better understood from the following detailed description of a preferred embodiment of the invention with reference to the drawing, in which the sole FIGURE is a diagram showing an apparatus for monitoring reactant vapors on their direct route to a CVD reactor before reaching the CVD reactor.

DETAILED DESCRIPTION OF A PREFERRED EMBODIMENT OF THE INVENTION

Referring now to the drawing, there is shown an apparatus which monitors reactant vapors at full concentration before reaching a chemical vapor deposition (CVD) reactor. The reactant vapor source 1 may be maintained in an oven 2; however, the use of an oven is not necessary for reactants which are sufficiently volatile at room temperature. In the preferred embodiment of the invention, the reactant is aluminum tri-isopropoxide which is heated to temperatures where it is likely to decompose. If an oven is used, plumbing lines throughout this apparatus should be heated to maintain the temperature of the reactant.

A plumbing line 3 leads to an infrared (IR) cell 4. A Fourier transform infrared (FTIR) spectrometer 5 optically coupled to the IR cell 4 analyzes the full concentration of vapor flowing through the IR cell 4 before it travels to the CVD reactor 11. The FTIR spectrometer 5 sends information to a process controller 6 which controls a valve 7. The process controller 6 operates the valve 7 based upon the information it receives from the FTIR spectrometer 5. A line 8 leads from the IR cell 4 through an optional mass flow controller (MFC) 9 to the valve 7. The outputs from the valve 7 are a line 10 leading to the CVD reactor 11 and a line 12 leading to the system pump 13. A line 14 leads from the CVD reactor 11 to the system pump 13, for controlling the operating pressure of the CVD reactor.

When the reactant vapor flowing in the IR cell 4 is analyzed by the FTIR spectrometer 5, information is given to the process controller 6 indicating whether contaminants or decomposition products are present. A composition of reactant vapor which is harmful to the reactor or workpiece within the reactor will cause the process controller 6 to operate the valve 7 to switch such that the reactant vapor will proceed through line 12 to pump 13, rather than through line 10 to the reactor 11. If the composition of the reactant vapor is appropriate, the valve 7 will be operated to direct the reactant vapor through line 10 to CVD reactor 11 and proceed to reaction with workpiece 15.

In a specific application of the invention, the ATI in ampule 1 is heated in the oven 2, causing decomposition products to form. The valve 7 is initially operated by the process controller 8 to direct the flow of the vapors flowing through the IR cell 4 to the pump 13. The decomposition products are more volatile than the ATI and will be pumped out of the line. Eventually, only ATI will be detected to be flowing through the IR cell 4 by the FTIR spectrometer 5, and the process controller 6 will, at that time, operate the valve 7 to pass the pure ATI to the CVD reactor 11.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A method of monitoring and controlling the flow of a reactant vapor to a reactor chamber, said method comprising the steps of:

transporting said reactant vapor through an infrared cell in a reactant delivery line, said infrared cell having windows transparent to infrared radiation;

analyzing said reactant vapor flowing through said infrared cell using a Fourier transform infrared spectrometer;

sending information derived from said analyzing step to a process controller which controls a valve in said reactant delivery line down stream from said infrared cell; and remotely operating said valve in response to said information sent to said process controller to send said reactant vapor through a first line to said reactor chamber or through a second line to bypass said reactor chamber when contaminants are detected by said infrared cell while maintaining the pressure of said reactant delivery line.

2. A method of monitoring and controlling the flow of a reactant vapor as recited in claim 1 wherein said reactor chamber is used for semiconductor manufacture and the specific mode of semiconductor manufacture is chemical vapor deposition.

3. A method of monitoring and controlling the flow of a reactant vapor to a reactor chamber said method comprising the steps of:

heating a reactant source to form reactant vapor of aluminum tri-isopropoxide in an oven;

transporting said reactant vapor through an infrared cell in a reactant delivery line, said infrared cell having windows transparent to infrared radiation;

analyzing said reactant vapor flowing through said infrared cell using a Fourier transform infrared spectrometer;

sending information derived from said analyzing step to a process controller which controls a valve in said reactant delivery line down stream from said infrared cell;

remotely operating said valve in response to said information sent to said process controller to send said reactant vapors through a first line to said reactor chamber or through a second line to bypass said reactor chamber while maintaining the pressure of said reactant delivery line, wherein said valve is initially operated to divert vapors, including decomposition, nondesirable, or nonuseful products of aluminum tri-isopropoxide, passing through said infrared cell and said valve is operated to pass the reactant vapor to the reactor chamber when no decomposition, nondesirable, or nonuseful products are detected in the analyzing step.

4. A method of monitoring and controlling the flow of a reactant vapor as recited in claim 3 wherein said reactor chamber is used for semiconductor manufacture and the specific mode of semiconductor manufacture is chemical vapor deposition.

* * * * *